United States Patent
Kwon (10) Patent No.: US 8,036,840 B2
(45) Date of Patent: Oct. 11, 2011

(54) BATTERY MANAGEMENT METHOD

(75) Inventor: Beom Joo Kwon, Gwangjin-gu (KR)

(73) Assignee: Hyundai Motor Company, Seoul (KR)

(*) Notice: Subject to any disclaimer, the term of this patent is extended or adjusted under 35 U.S.C. 154(b) by 349 days.

(21) Appl. No.: 12/345,176

(22) Filed: Dec. 29, 2008

(65) Prior Publication Data

US 2009/0319208 A1  Dec. 24, 2009

(30) Foreign Application Priority Data

Jun. 24, 2008 (KR) .......................... 10-2008-0059870

(51) Int. Cl.
  *G01R 31/36* (2006.01)
(52) U.S. Cl. ............. 702/63; 702/60; 324/439; 320/132
(58) Field of Classification Search .................... 702/63, 702/60; 324/439; 320/132
  See application file for complete search history.

(56) References Cited

U.S. PATENT DOCUMENTS

2005/0285445 A1\* 12/2005 Wruck et al. ................ 307/10.1

FOREIGN PATENT DOCUMENTS

| JP | 2001-166019 | 6/2001 |
| JP | 2003-047108 | 2/2003 |
| KR | 10-2008-028160 | 3/2008 |

\* cited by examiner

*Primary Examiner* — Drew A Dunn
*Assistant Examiner* — Hien Vo
(74) *Attorney, Agent, or Firm* — Edwards Angell Palmer & Dodge LLP; Peter F. Corless (57) ABSTRACT

A battery management method is provided which suitably includes measuring voltage, current and temperature of a battery, calculating the State of Charge (SOC) of the battery using the integration value of the measured current of the battery, and calibrating the calculated SOC of the battery. The voltage, current and temperature of the battery are measured by an Electronic control Unit (ECU).

4 Claims, 8 Drawing Sheets

|  | Availability of CAN communication | consumed current | | |
|---|---|---|---|---|
|  |  | Min | Normal | Max |
| head lamps, cluster illumination light, directional light, wipers, and the like | 0 | 0.5mA | 15A | 30A |
| indoor lamps, courtesy lamps, and the like | 0 | 0.3mA | 5A | 10A |
| blower motor, heater/air conditioner, and the like | 0 | 0.5mA | 5A | 20A |
| Aftermarket ACC products | X | ? | ? | ? |
| ● ● ● | ● ● ● | ● ● ● | ● ● ● | ● ● ● |

| α value (weight) | α<1 | α=1 | α>1 |
|---|---|---|---|
| Description | $SOC_{ocv} <$ $SOC_{current\ integration}$ | $SOC_{ocv} <$ $SOC_{current\ integration}$ (Default state) | $SOC_{ocv} >$ $SOC_{current\ integration}$ |
| driving habits (user data) | expressway-centered driving/use of small amount of ACC power | average driver | city road-centered driving /use of large amount of ACC power by audio, video, aftermarket product or the like |

BATTERY MANAGEMENT METHOD

CROSS-REFERENCE TO RELATED APPLICATIONS

This application claims under 35 U.S.C. §119(a) priority to Korean Application No. 10-2008-0059870, filed on Jun. 16, 2008, the disclosure of which is incorporated herein by reference in its entirety.

BACKGROUND

1. Technical Field

The present invention relates generally to a battery management method, and, more particularly, to a battery management method of calculating the State Of Charge (SOC) of a battery without using battery sensors.

2. Related Art

In general, electric and electronic devices, such as head lamps, indoor lamps and cluster illumination lights, are installed in a vehicle and electricity is supplied to the electric or electronic components through a battery provided in the vehicle.

A battery should be maintained at an appropriate SOC so as to achieve stability, lifespan amelioration and high output power, and the state of the battery is managed by frequently measuring the SOC of the battery so as to achieve the above purposes. Furthermore, since an alternator is controlled so that only a minimum amount of voltage for the maintenance of a battery at an appropriate SOC is applied, the effect of improving fuel economy is achieved.

Meanwhile, it is very important to accurately measure the SOC of a battery. For this purpose, the SOC of a battery is calculated by measuring the voltage, current and temperature of the battery.

However, in order to measure the voltage, current and temperature of a battery, separate battery sensors must be additionally provided, which requires additional time and cost for their installation.

Furthermore, since the SOC of a battery varies depending on the characteristics of a user, a more reliable battery management method is required.

The above information disclosed in this Background section is only for enhancement of understanding of the background of the invention and therefore it may contain information that does not form the prior art that is already known in this country to a person of ordinary skill in the art.

SUMMARY

An object of the present invention is to provide a battery management method that does not employ battery sensors, enables a reduction in cost, and is accurate and reliable.

In order to accomplish the above object, one aspect of the present invention provides a battery management method, including measuring voltage, current and temperature of a battery; calculating the State Of Charge (SOC) of the battery using an integration value of the measured current of the battery; and calibrating the calculated SOC of the battery; wherein the voltage, current and temperature of the battery are measured by an Electronic Control Unit (ECU).

When a vehicle is traveling, the voltage of the battery may be measured based on a function of exciting current and revolutions per minute (rpm) of an engine When ignition is turned on, the current of the battery may be measured using the difference between the output of an alternator and a total amount of consumed current.

The total amount of consumed current may be measured using the sum of average amounts of consumed current in which a weight or weights for average amounts of consumed current of respective electric or electronic components are taken into account.

When ignition is turned off, the current of the battery may be measured using the dark current of the vehicle.

The temperature of the battery may be measured using an outside air temperature sensor and a coolant temperature sensor.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above and other features of the invention are discussed infra.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Reference now should be made to the drawings, in which the same reference numerals are used throughout the different drawings to designate the same or similar components.

Figure 1:
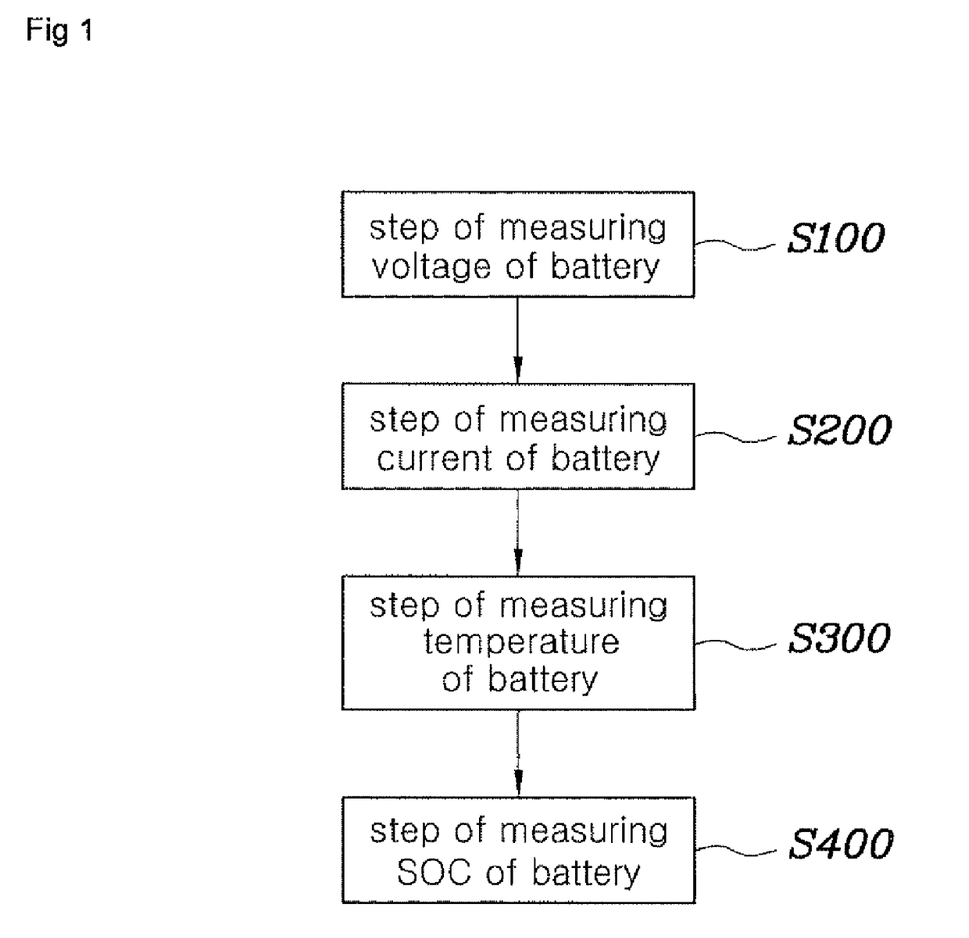
FIG. 1 is a flowchart showing a battery management method according to an embodiment of the present invention.
Figure 2:
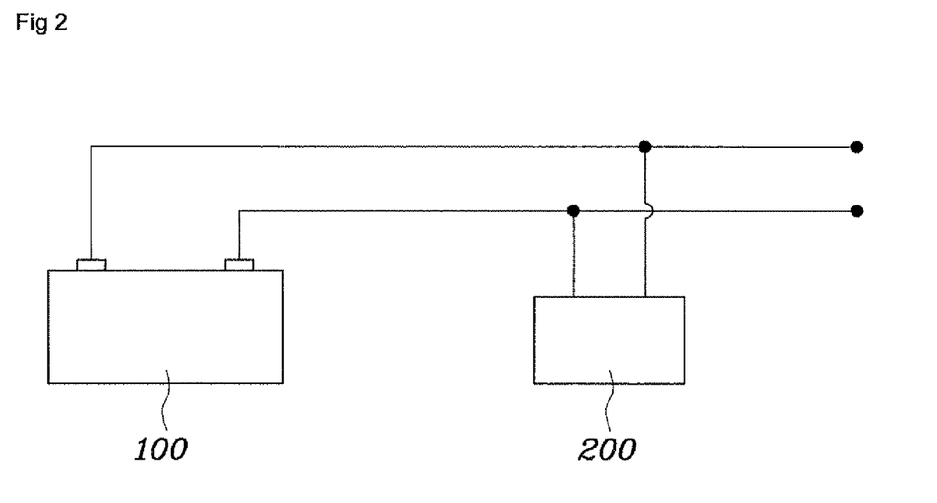
FIG. 2 is a diagram showing the connection between a control unit and a battery according to an embodiment of the present invention.

Referring to FIGS. 1 and 2, the battery management method according to an embodiment of the present invention may include the step S100 of measuring the voltage of a battery 100, the step S200 of measuring the current of the battery, the step S300 of measuring the temperature of the battery, and the step S400 of calculating the SOC of the battery using the current integration value of the battery under the condition of the measured voltage and temperature.

The voltage of the battery 100 is measured by an Electronic Control Unit (ECU) 200, and the ECU 200 is connected to the battery 100 via wire, as shown in FIG. 2. The ECU 200 is provided with a voltage measurement circuit (not shown) for measuring operating voltage from every electric or electronic component, and the ECU 200 wakes up at regular intervals and measures Open Circuit Voltage (OCV) using the voltage measurement circuit.

The voltage of the battery 100 may be measured when a vehicle is stopped and when a vehicle is traveling. For example, when a vehicle is stopped, the voltage of the battery 100 is measured using Equation 1, and when the vehicle is traveling, the voltage of the battery 100 is measured using Equation 2 as follows:

$$V_{parking} = V_{ECU} \quad (1)$$

Here, $V_{parking}$ is a voltage value measured when a vehicle is stopped, and $V_{ECU}$ is a voltage value measured by the ECU 200. As illustrated by Equation 1, when a vehicle is stopped, it is determined that $V_{ECU}$ is equal to $V_{parking}$. In this case, although the OCV measured by the ECU 200 is subjected to voltage drop attributable to wiring between the battery 100 and the ECU 200, there is little voltage drop when the vehicle is stopped because only minimum current, for example, dark current, flows.

$$V_{run} = f(V_{ECU}, I_{excite}, \text{rpm}) \quad (2)$$

Here, $V_{run}$ is a voltage value measured when a vehicle is traveling, $I_{excite}$ is an exciting current, and rpm is a number of revolution of an engine. As illustrated by Equation 2, since, for a traveling vehicle, $V_{ECU}$ is influenced by voltage drop attributable to wiring, calibration must be performed using alternator-side output voltage. In order to calculate the amount of voltage drop, $I_{excite}$ and rpm values, which are controlled by the ECU 200, are used. Accordingly, $V_{run}$ has a value identical or close to actual battery voltage through the calibration of the measured $V_{ECU}$.

As described above, the voltage of the battery 100 can be measured using the values calculated using Equations 1 and 2, and can be measured within an error range from −0.2 V to +0.2 V.

After the step S100 of measuring battery voltage has been performed, the step S200 of measuring battery current is performed.

Figure 3:
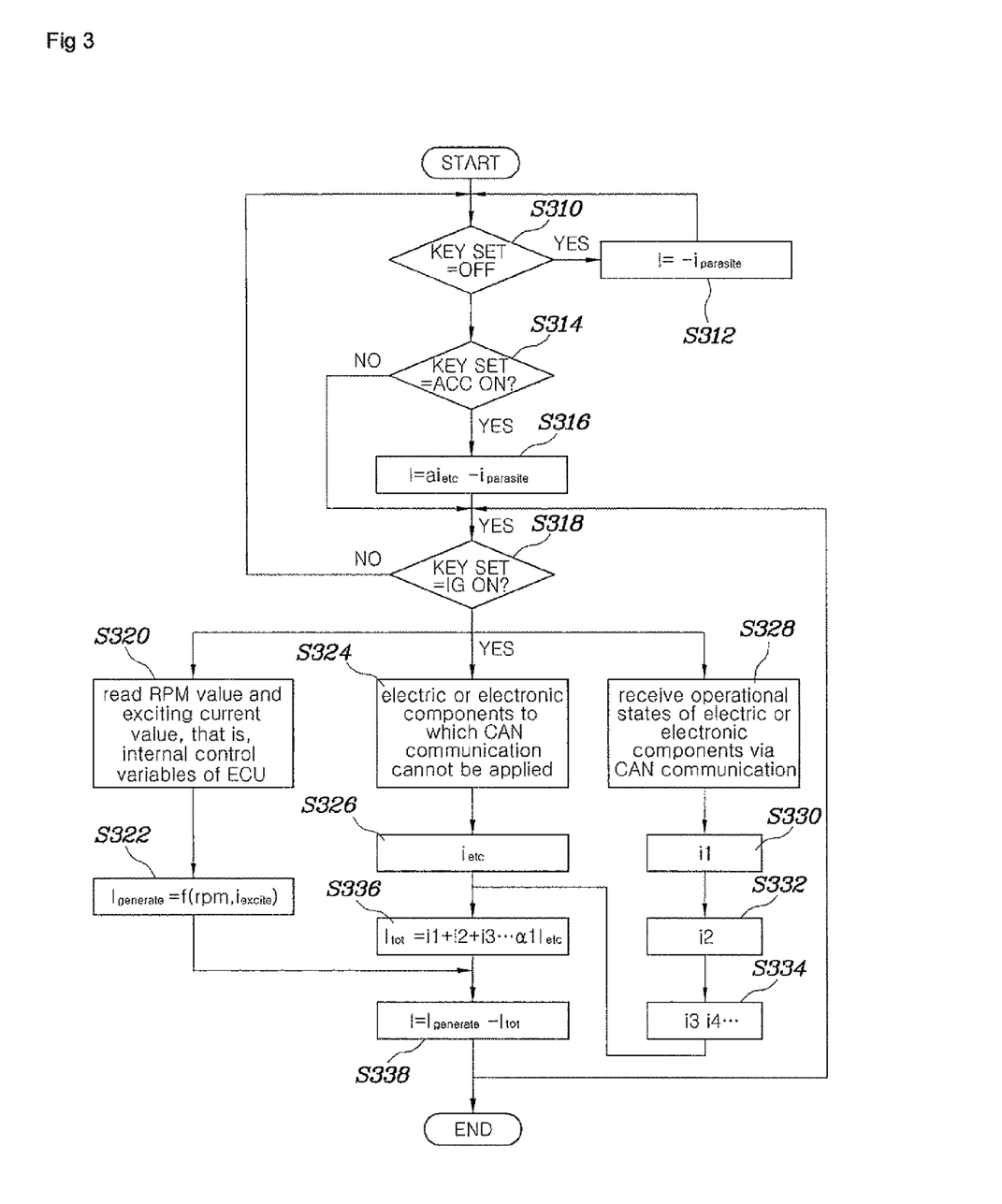
FIG. 3 is a flowchart showing a method of measuring the current of a battery according to an embodiment of the present invention.

To measure the current of the battery 100, the step S310 of determining whether an ignition key is turned off (e.g., ignition is turned off) is performed first, as shown in FIG. 3. If it is determined that the ignition key is turned off, and then the step S312 of measuring the battery current by measuring average dark current $i_{parasite}$ is performed. The reason for this is that in case the ignition is OFF, the output of the alternator is 0 and the amount of current consumed by the other electric or electronic components is close to 0, so that the current can be measured using only a vehicle dark current value. Here, the current of the battery is measured at regular intervals, for example, 30 seconds, and the current value of the battery has a negative value when the vehicle is stopped.

In contrast, if it is determined that an ignition key is not turned off, the step S314 of determining whether the ignition key is turned to ACC position is performed. If it is determined that the ignition key is turned to the ACC position, the step S316 of measuring the current of the battery based on a value obtained by multiplying an average amount of consumed ACC current by a user-based weight α and based on average dark current $i_{parasite}$.

Thereafter, the step S318 of determining whether the ignition key is turned to the ON position (e.g., ignition is turned on) is performed. Here, if it is determined that the ignition is not turned on, consumed current in an ACC ON interval is measured at regular intervals, for example, five seconds. Here, since the alternator is not operating, the current value is negative.

If it is determined that the ignition key is turned to the ON position (e.g., ignition is turned on), the current of the battery 100 is measured. In this case, the current of the battery 100 can be obtained by obtaining a total amount of current consumed by all electric or electronic components of the vehicle.

Figure 4:
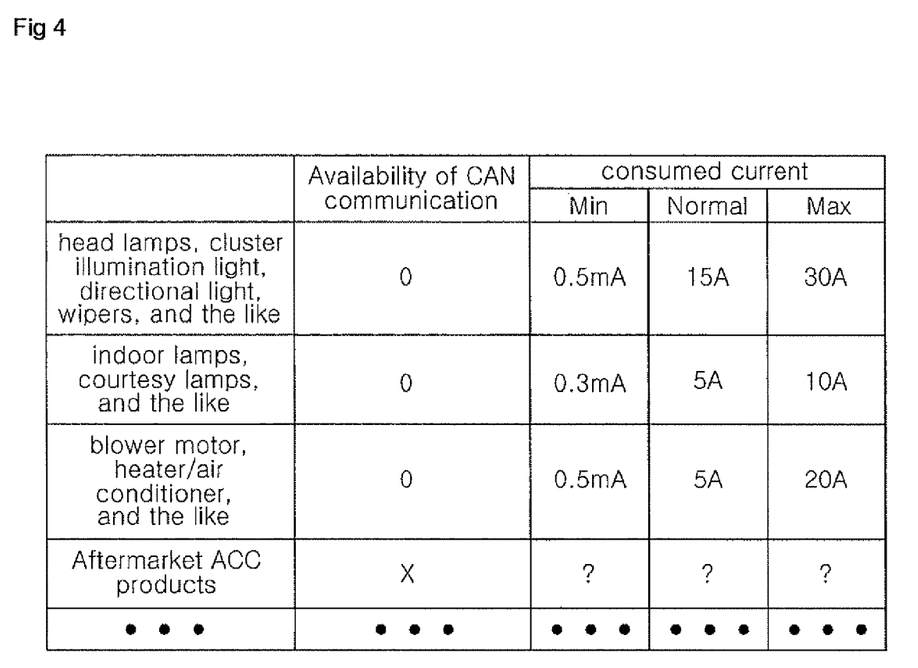
FIG. 4 is a table illustrating data collected by the control unit according to an embodiment of the present invention.

For this purpose, first, the ECU 200 lists all electric or electronic components of the vehicle that use electric power. As shown in FIG. 4, the ECU 200 classifies electric or electronic components according to the operational mode, and collects information about corresponding minimum current, maximum current and normal current.

For example, the electric or electronic components may be classified into first mode components such as head lamps, cluster illumination lights and directional lights, second mode components such as indoor lamps and courtesy lamps, and third mode components such as a blower motor, a heater and an air conditioner. When one or more electric or electronic components are installed in addition to the electric or electronic components provided in the vehicle, the average amount of current consumed by the electric or electronic components that operate in the ACC state can be obtained. Here, information about first to third mode components may be collected via Controller Area Network (CAN) communication within the vehicle, whereas data about additional electric or electronic components is not collected via CAN communication.

Accordingly, the total amount of consumed current can be obtained by respectively calculating the value of the operational states of the electric or electronic components that are collected via CAN communication and the values of the operational states of the electric or electronic components that are not collected via CAN communication.

In order to calculate the amount of consumed current of electric or electronic components that is collected via CAN communication, the step S328 of receiving the operational states of electric or electronic components via CAN communication is performed. Thereafter, the steps S330, S332 and S334 of obtaining the average amounts of consumed current $i_1, i_2, i_3, \ldots$ based on the modes of the electric or electronic components collected via CAN communication are performed.

Furthermore, in order to calculate the amount of current consumed by electric or electronic components that is not collected via CAN communication, the step S324 of receiving the operational states of the electric or electronic components that are not collected via CAN communication is performed. Thereafter, the step S326 of obtaining the average amount of consumed current by measuring the received current values of the electric or electronic components and integrating the current values is performed. Here, since it is difficult to calculate the current value of each electric or electronic component added to the vehicle based on a user's characteristics, a weight α based on the user's characteristics can be multiplied.

Thereafter, the step S336 of obtaining the total amount of consumed current $I_{tot}$ by adding together the average amount of consumed current of the electric or electronic components collected via CAN communication and the average amount of consumed current of the electric or electronic components not collected via CAN communication is performed.

Thereafter, the ECU 200 performs the step S320 of reading rpm and an exciting current $i_{excite}$ values, which are the internal control variables of the ECU 200, and performs the step S322 of calculating the output $I_{Generate}$ of the alternator based on a function of the rpm and $i_{excite}$ values.

Thereafter, the step S338 of measuring the current of the battery when ignition is turned on using the difference between the output value $I_{Generate}$ of the alternator and the total amount of consumed current $I_{tot}$ is performed.

Figure 5A:
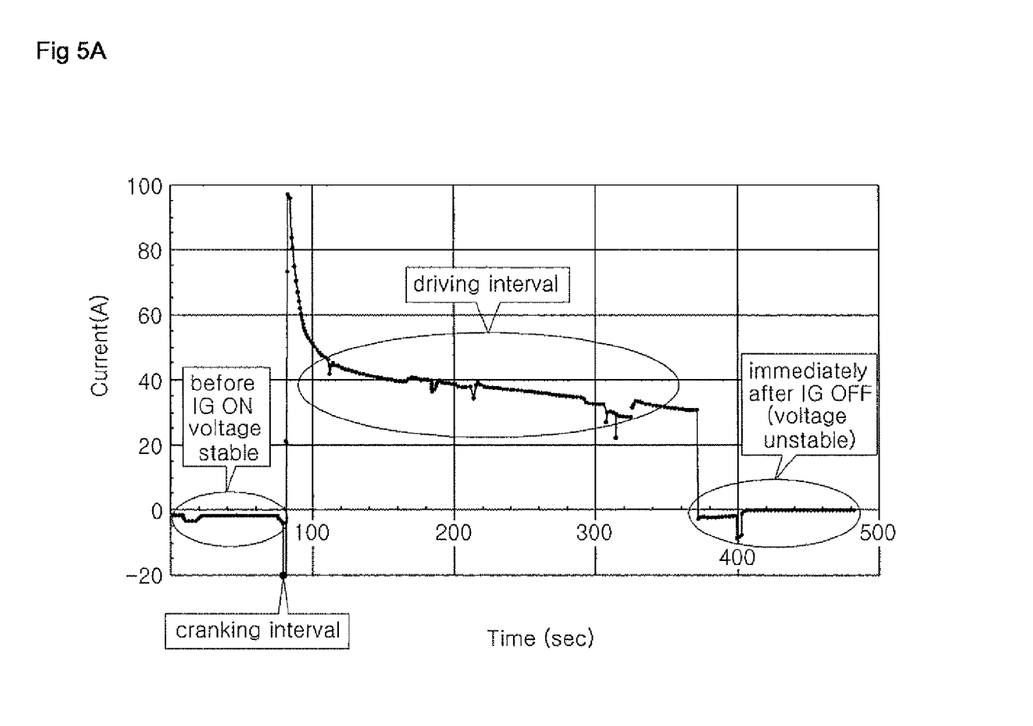
FIGS. 5A and 5B are graphs respectively illustrating data actually measured for a battery according to an embodiment of the present invention and data measured through a simulation.
Figure 5B:
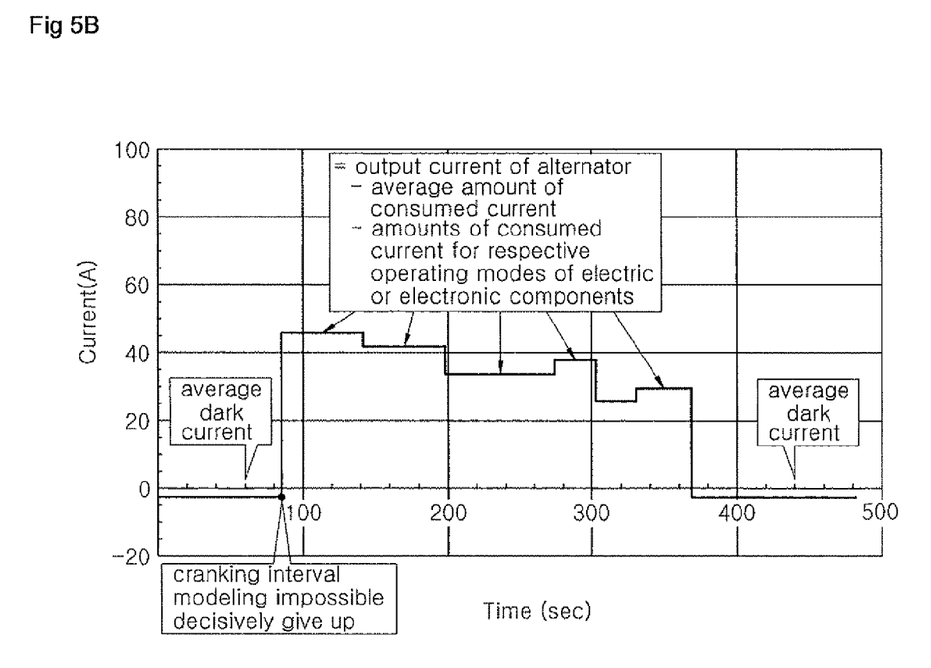

Actual measurement data of FIG. 5A is similar to simulated measurement data of FIG. 5B using the above-described method, which shows the accuracy and reliability of the method.

After the step S200 of measuring the current of the battery has been performed as described above, the step S300 of measuring the temperature of the battery is performed.

Figure 6:
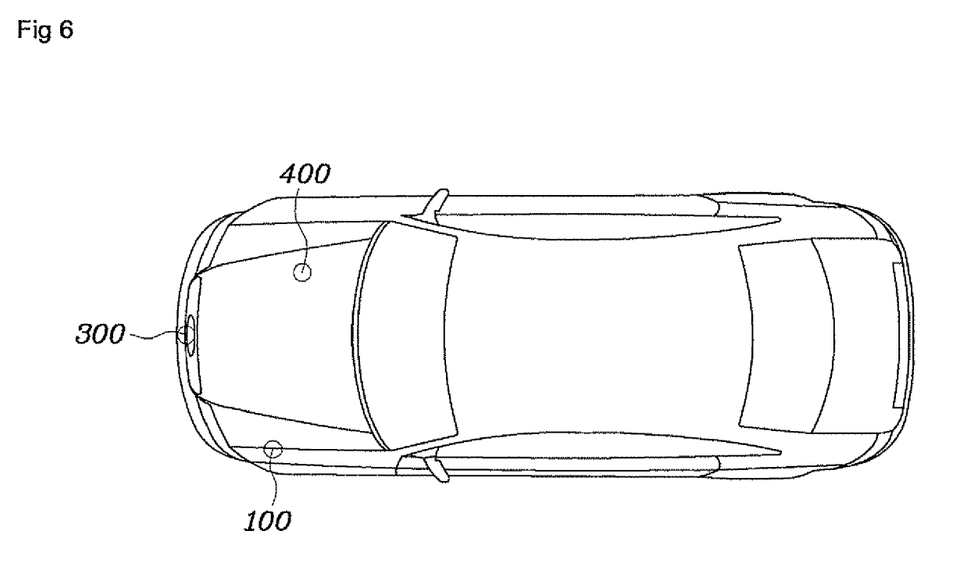
FIG. 6 is a plan view showing the locations of sensors that are arranged to measure the temperature of a battery according to an embodiment of the present invention.

As shown in FIG. 6, the temperature of the battery 100 may suitably be calculated in such a way that the ECU 200 receives and integrates sensor values from an outside air temperature sensor 300 and a coolant temperature sensor 400. The outside air temperature sensor 300 functions to measure the temperature of the battery 100 attributable to direct rays of light, thereby being capable of measuring the outside temperature of the vehicle. The coolant temperature sensor 400 functions to measure the temperature of the battery 100 attributable to engine heat, thereby being capable of measuring the temperature of the battery attributable to engine heat.

Although a method of performing indirect estimation using the ASIC temperature of a battery sensor has been conventionally used, the ASIC temperature or surrounding air temperature changes rapidly because the thermal capacity thereof is low while the internal temperature of the battery changes slowly because the thermal capacity thereof is high. As a result, a value that is tuned in the ASIC according to the conventional battery sensor is equal to that measured by an ECU and tuned according to the present invention. Accordingly, although battery sensors are eliminated in the present invention, the present methods ensure accuracy and reliability.

After the step S300 of measuring the temperature of the battery as described above has been performed, the step S400 of calculating the SOC of the battery from the measured current of the battery is performed. The SOC of the battery 100 is calculated using the integration value of the measured current of the battery, and the calculated SOC of the battery is corrected through calibration.

Since it is impossible to arrange current values in the form of data because the weight value used is based on drivers' driving habits, more accurate and reliable data can be obtained when the SOC of the battery is calibrated.

Figure 7:
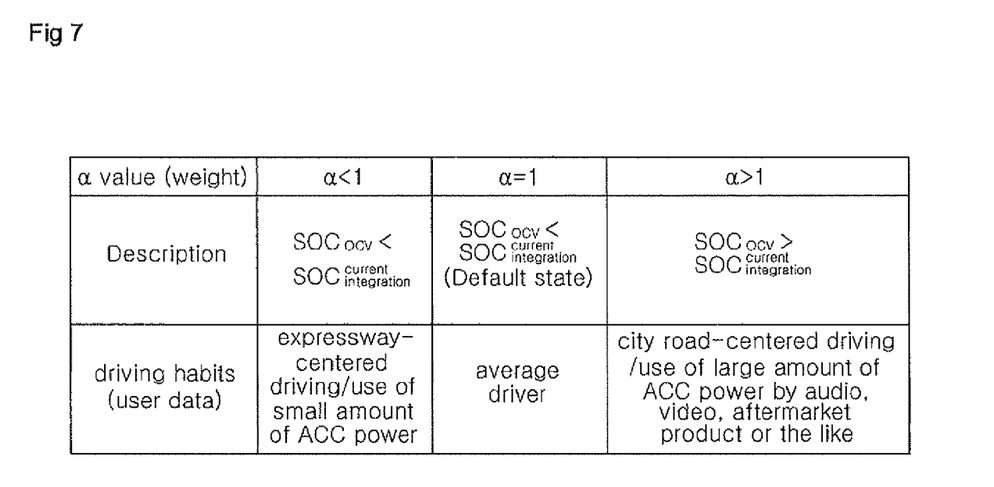
FIG. 7 is a diagram illustrating drivers' weight-based characteristics according to an embodiment of the present invention.

As shown in FIG. 7, the weight value varies according to a driver's driving habits, with the result that $SOC_{ocv}$ and $SOC_{current\ integration}$ are different from each other. Accordingly, when SOC calibration is performed many times, the weight value is continuously updated until the vehicle reaches its lifespan, with the result that the difference between $SOC_{ocv}$ and $SOC_{current\ integration}$ is reduced. As a result, as time goes by, more accurately and reliably data can be obtained through the calibration of the SOC of a battery.

The present invention has an advantage in that manufacturing cost can be reduced by calculating the SOC of a battery using data collected by the control unit without using battery sensors. Furthermore, the present invention has an advantage in that the SOC of the battery can be accurately and reliably measured by calibrating the value of current in consideration of a weight based on the user's characteristics.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A battery management method, comprising:
    measuring voltage, current and temperature of a battery;
    calculating a State Of Charge (SOC) of the battery using an integration value of the measured current of the battery; and
    calibrating the calculated SOC of the battery;
    wherein the voltage, current and temperature of the battery are measured by an Electronic Control Unit (ECU), and
    when ignition is turned on, the current of the battery is measured using a difference between an output of an alternator and a total amount of consumed current, and
    the total amount of consumed current is measured using a sum of average amounts of consumed current in which a weight or weights for average amounts of consumed current of respective electric or electronic components are taken into account.

2. The battery management method as set forth in claim 1, wherein, when a vehicle is traveling, the voltage of the battery is measured based on a function of exciting current and revolutions per minute (rpm) of an engine.

3. The battery management method as set forth in claim 1, wherein, when ignition is turned off, the current of the battery is measured using dark current of the vehicle.

4. The battery management method as set forth in claim 1, wherein the temperature of the battery is measured using a value detected by an outside air temperature sensor and a value detected by a coolant temperature sensor.

* * * * *